(12) United States Patent
Zhang et al.

(10) Patent No.: US 8,735,973 B2
(45) Date of Patent: May 27, 2014

(54) TRENCH-GATE MOSFET DEVICE AND METHOD FOR MAKING THE SAME

(75) Inventors: Lei Zhang, Chengdu (CN); Donald Ray Disney, Cupertino, CA (US); Tiesheng Li, San Jose, CA (US); Rongyao Ma, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 13/462,397

(22) Filed: May 2, 2012

(65) Prior Publication Data

US 2012/0280311 A1    Nov. 8, 2012

(30) Foreign Application Priority Data

May 3, 2011    (CN) .......................... 2011 1 0117821

(51) Int. Cl.
   *H01L 29/78*    (2006.01)
(52) U.S. Cl.
   USPC ................... 257/330; 438/270; 257/E29.262; 257/E21.41

(58) Field of Classification Search
   CPC ................ H01L 29/78; H01L 29/7827; H01L 29/66666
   USPC .............. 257/330, E29.262, E21.41; 438/270
   See application file for complete search history.

(56) References Cited

U.S. PATENT DOCUMENTS

| 2003/0011027 A1* | 1/2003 | Zeng et al. ..................... 257/329 |
| 2007/0075392 A1* | 4/2007 | Pan et al. ....................... 257/483 |
| 2009/0212358 A1* | 8/2009 | Shiraishi et al. .............. 257/330 |

* cited by examiner

*Primary Examiner* — Kevin Parendo
*Assistant Examiner* — Lamont Koo
(74) *Attorney, Agent, or Firm* — Perkins Coie LLP

(57) ABSTRACT

The embodiments of the present disclosure disclose a trench-gate MOSFET device and the method for making the trench-gate MOSFET device. The trench-gate MOSFET device comprises a curving dopant profile formed between the body region and the epitaxial layer so that the portion of the body region under the source metal contact has a smaller vertical thickness than the other portion of the body region. The trench-gate MOSFET device in accordance with the embodiments of the present disclosure has improved UIS capability compared with the traditional trench-gate MOSFET device.

6 Claims, 8 Drawing Sheets

TRENCH-GATE MOSFET DEVICE AND METHOD FOR MAKING THE SAME

CROSS-REFERENCE TO RELATED APPLICATION(S)

This application claims the benefit of CN application No. 201110117821.X, filed on May 3, 2011, and incorporated herein by reference.

TECHNICAL FIELD

The present disclosure relates generally to MOSFET devices, and more particularly but not exclusively to trench-gate MOSFET devices.

BACKGROUND

Trench-gate MOSFET devices are widely used in power management field due to their outstanding efficiency performance and low cost. When they are used in circuits with inductive loads, the unclamped inductive switching (UIS) capability becomes a key parameter of the trench-gate MOSFET devices.

FIG. 1 schematically illustrates a MOSFET device used in a circuit with an inductive load. As illustrated in FIG. 1, the inductor L releases energy through the MOSFET M when the MOSFET M is turned on. Because the inductor current should be continuous, the body diode A of the MOSFET M is broken down and the inductor L continues to release energy through the body diode A when the MOSFET M is turned off. The UIS capability indicates the ability of the MOSFET device to dissipate all the energy stored in the inductive load through its body diode without suffering any damage.

FIG. 2 illustrates a plurality of prior art N-type trench-gate MOSFET devices. Referring to a separate N-type trench-gate MOSFET of FIG. 2, the trench-gate MOSFET comprises an N-type substrate N-sub configured as the drain D of the MOSFET and an N-type epitaxial layer N-epi formed on the substrate N-sub. A gate dielectric layer GOX with a polysilicon region Poly located therein is formed in the epitaxial layer N-epi. The polysilicon region Poly is configured as the gate G of the MOSFET. The trench-gate MOSFET also comprises a P-type body region P-body adjacent to the gate dielectric layer GOX, an N-type highly doped region located on the body region P-body and configured as the source of the MOSFET, and a source metal contact S. The trench-gate MOSFET further comprises a P-type highly doped region located beneath the source metal contact S.

As shown in FIG. 2, in the trench-gate MOSFET, an equivalent parasitic diode A is formed between the epitaxial layer N-epi and the body region P-body. The trench-gate MOSFET also comprises an equivalent parasitic bipolar transistor B with its base in the body region P-body, its emitter in the N-type highly doped region and its collector in the epitaxial layer N-epi.

FIG. 3 illustrates the reverse current of the trench-gate MOSFET device shown in FIG. 2 under UIS condition. As shown in FIG. 3, when a reverse breakdown occurs in the equivalent parasitic diode A of the trench-gate MOSFET under the UIS condition, a reverse current flows from the drain D to the source S and a forward voltage is generated between the body region P-body and the N-type highly doped region. The body region P-body is lightly doped and has a relatively high resistance, thus the forward voltage is relatively high and greater than the base-to-emitter on-threshold $V_{BEon}$ of the parasitic bipolar transistor B. As a result, the parasitic bipolar transistor B is turned on, and the reverse current is magnified and out of control. The MOSFET can not be turned off by the gate voltage and will be destroyed permanently.

Thus, improving the UIS capability of the trench-gate MOSFET device is highly desired.

SUMMARY

In one embodiment, the present disclosure is directed to a trench-gate MOSFET device comprising a substrate of a first conductive type; an epitaxial layer of the first conductive type formed on the substrate, wherein the epitaxial layer has a top surface; a gate dielectric layer formed in the epitaxial layer; a gate formed in the gate dielectric layer; a body region formed in the epitaxial layer adjacent to the gate dielectric layer, wherein the body region has a second conductive type opposite to the first conductive type; a source of the first conductive type formed on the body region; a source metal contact extending through the source into the body region; and at least one highly doped region of the second conductive type located in the body region under the source metal contact. A curving dopant profile is formed between the body region and the epitaxial layer so that the portion of the body region under the source metal contact has a smaller vertical thickness than the other portion of the body region.

In one embodiment, the present disclosure is directed to a method of manufacturing a trench-gate MOSFET device comprising providing a substrate of a first conductive type; forming an epitaxial layer of the first conductive type on the substrate, wherein the epitaxial layer has a top surface; forming a gate dielectric layer in the epitaxial layer; forming a gate in the gate dielectric layer; forming a shielding layer on a part of the epitaxial layer; implanting ions into the epitaxial layer to form a body region, wherein the ions have a second conductive type opposite to the first conductive type; removing the shielding layer and thermal driving-in the body region to form a curving dopant profile between the body region and the epitaxial layer; forming a source of the first conductive type in the top of the body region; forming a trench extending through the source into the body region; forming at least one highly doped region of the second conductive type in the body region under the trench; and filling metal in the trench to form a source metal contact.

The use of the same reference label in different drawings indicates the same or like components.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present disclosure can be practiced without one or more specific details, or with other methods, components, materials, etc. In other instances, well-known structures, materials, processes or operations are not shown or described in detail to avoid obscuring aspects of the present invention.

The present disclosure provides a trench-gate MOSFET device with its unclamped inductive switching (UIS) capability greatly enhanced compared with that of the prior art trench-gate MOSFET devices.

Figure 1:
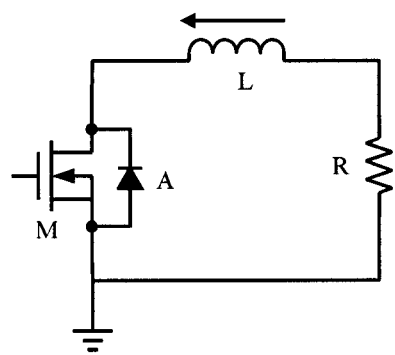
FIG. 1 schematically illustrates a MOSFET device used in a circuit with an inductive load.
Figure 2:
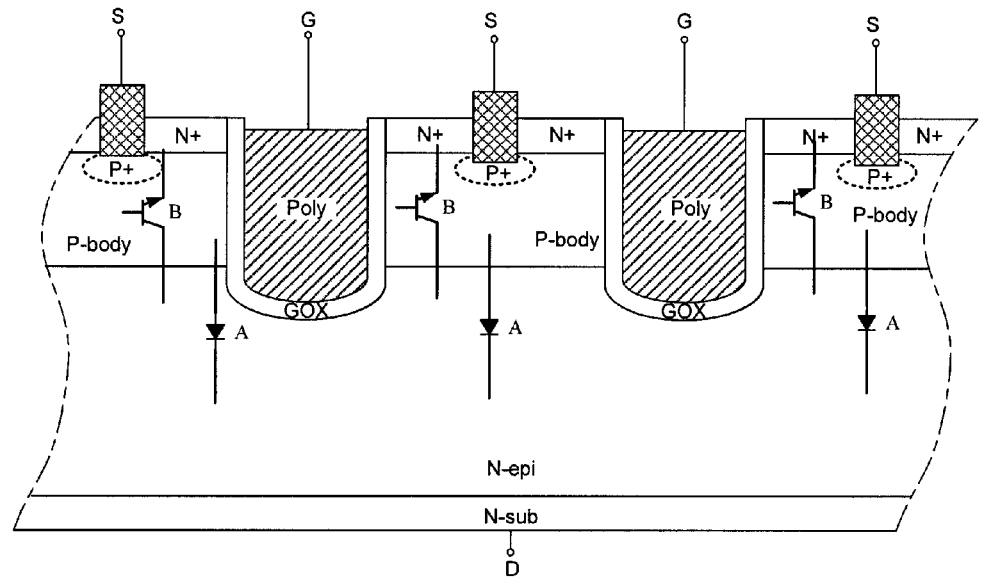
FIG. 2 illustrates a plurality of prior art N-type trench-gate MOSFET devices.
Figure 3:
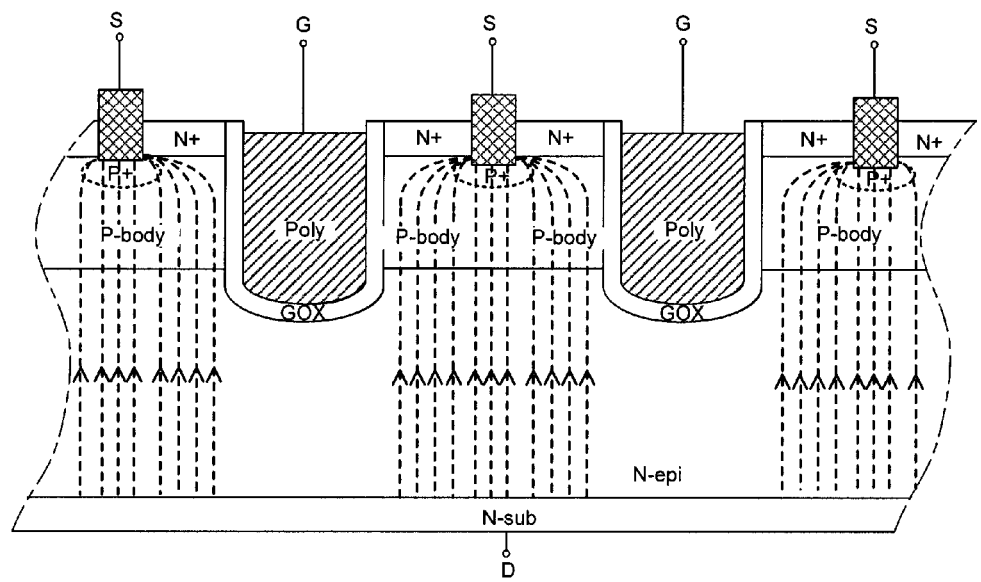
FIG. 3 illustrates the reverse current of the trench-gate MOSFET device of FIG. 2 under UIS condition.
Figure 4:
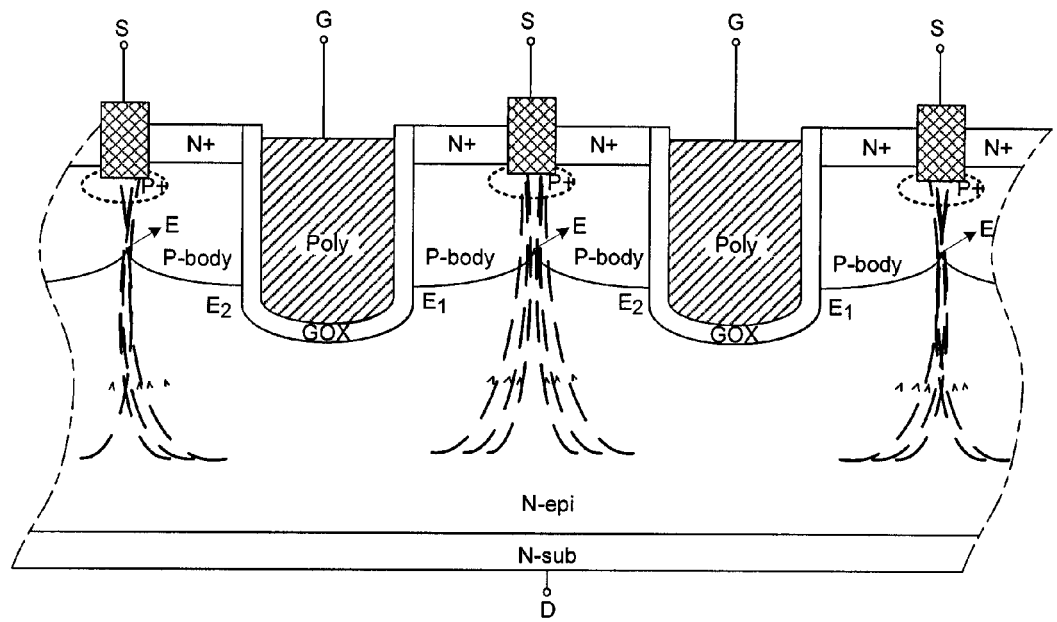
FIG. 4 illustrates a cross-sectional view of a trench-gate MOSFET device in accordance with one embodiment of the present disclosure.

FIG. 4 illustrates a cross-sectional view of a trench-gate MOSFET device in accordance with one embodiment of the present disclosure. As shown in FIG. 4, a curving dopant profile shown by the curve $E_1$-$E$-$E_2$ is formed between the P-type body region P-body and the N-type epitaxial layer N-epi in the trench-gate MOSFET device. As a result, the portion of the P-type body region P-body under the source metal contact S has a smaller vertical thickness than the other portions of the P-type body region P-body. That is, the peak point E of the body region P-body is under the source metal contact S.

As shown in FIG. 4, when a reverse breakdown occurs in the body diode of the trench-gate MOSFET under the UIS condition, the electric field converges around the peak point E due to the curving dopant profile, which leads to a highest electric field at the peak point E. Thus, a majority of the reverse current flows through the P-type highly doped region over the peak point E.

The P-type highly doped region has a higher doping concentration than the P-type body region P-body, and accordingly has a lower resistance. Thus, when the reverse current flows from the peak point E to the source metal contact S through the P-type highly doped region, the voltage drop produced is relatively low and lower than the base-to-emitter on-threshold $V_{BEon}$ of the equivalent parasitic bipolar transistor B. As a result, the reverse current is under control and the MOSFET device will not be destroyed. The UIS capability of the trench-gate MOSFET device is improved.

Figure 5:
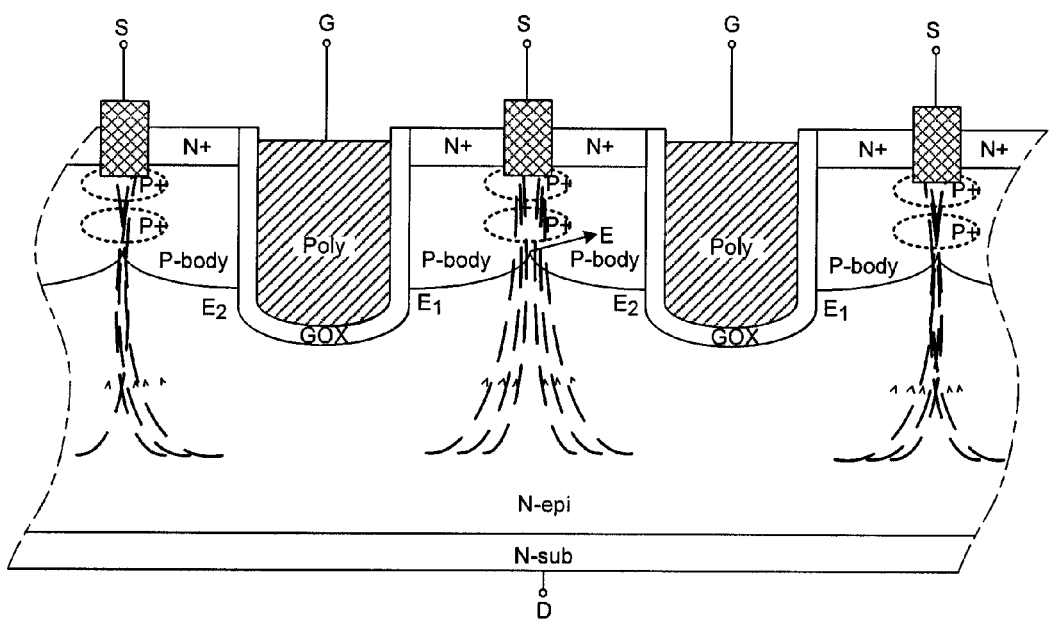
FIG. 5 illustrates a cross-sectional view of an improved trench-gate MOSFET device in accordance with another embodiment of the present disclosure.

FIG. 5 illustrates a cross-sectional view of an improved trench-gate MOSFET device in accordance with another embodiment of the present disclosure. Compared with the trench-gate MOSFET device of FIG. 4, the trench-gate MOSFET device of FIG. 5 comprises at least two P-type highly doped regions formed in the body region P-body. The at least two P-type highly doped regions are positioned along a vertical orientation under the source metal contact S, and the P-type highly doped region at the top is in contact with the source metal contact S.

When the reverse current flows through the at least two P-type highly doped regions, the voltage drop is further reduced and far from the base-to-emitter on-threshold $V_{BEon}$ of the equivalent parasitic bipolar transistor B. Thus, the UIS capability of the trench-gate MOSFET device is further improved.

In the embodiments shown in FIG. 4 and FIG. 5, a plurality of trench-gate MOSFETs are provided, and every two adjacent MOSFETs share a common source metal contact S. As shown in FIG. 4 and FIG. 5, the peak point E is at the midpoint between the gates of the two adjacent MOSFETs. Persons of ordinary skill in the art will recognize, however, that the peak point E can be any point under the source metal contact. Preferably, the peak point E is at the midpoint between the gates of the two adjacent MOSFETs.

FIGS. 6(a)~6(h) illustrate steps for fabricating a trench-gate MOSFET device in accordance with one embodiment of the present disclosure.

Figure 6A:
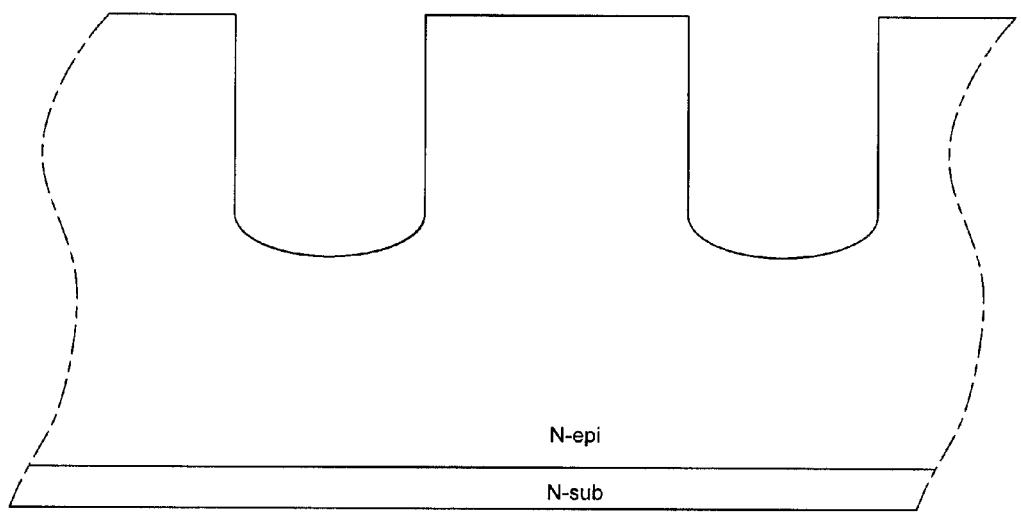
FIGS. 6(a)–6(h) illustrate steps for fabricating a trench-gate MOSFET device in accordance with one embodiment of the present disclosure.

Referring to FIG. 6(a), step a comprises growing an N-type epitaxial layer N-epi on an N-type substrate N-sub, and forming a trench in the epitaxial layer N-epi by etching.

Figure 6B:
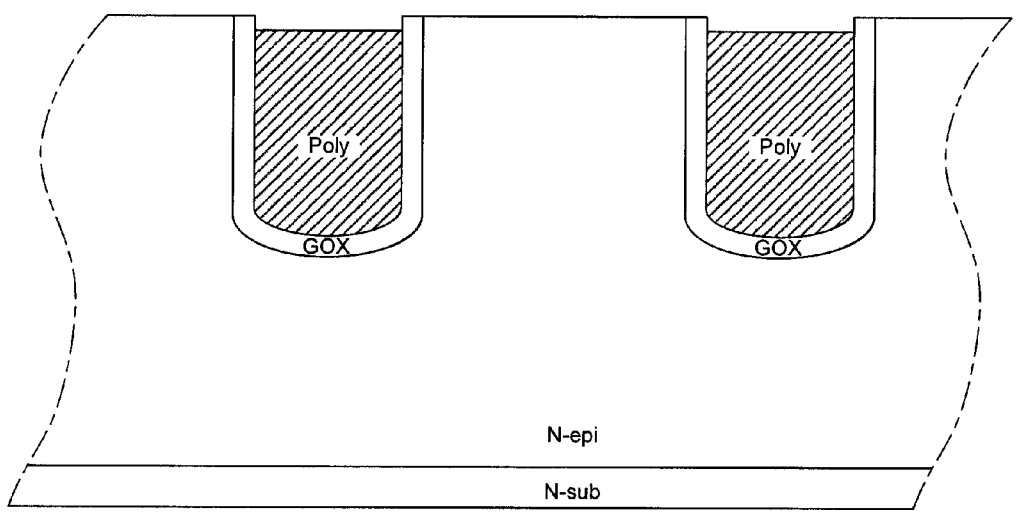

Referring to FIG. 6(b), step b comprises growing a gate dielectric layer GOX in the trench, and forming a polysilicon region Poly in the gate dielectric layer GOX.

Figure 6C:
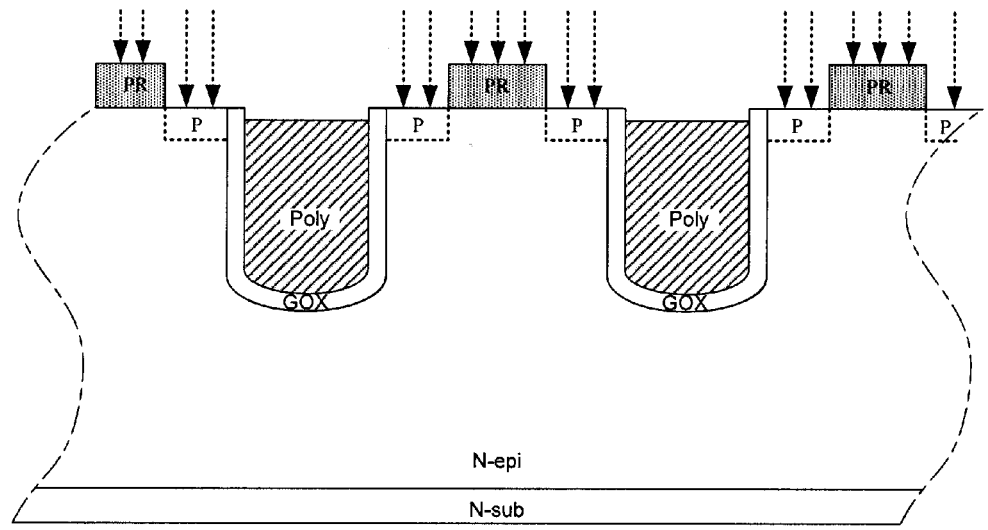

Referring to FIG. 6(c), step c comprises forming a photo resist shield layer PR on the mesa region between two adjacent gate dielectric layers GOX, and then implanting P-type ions into the epitaxial layer N-epi.

Figure 6D:
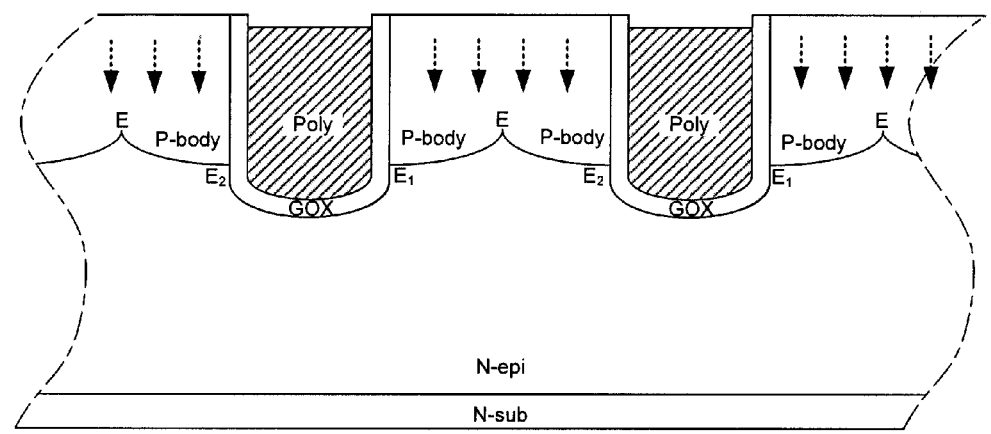

Referring to FIG. 6(d), step d comprises removing the photo resist shield layer PR, and then forming a P-type body region P-body by thermal driving-in.

Figure 6E:
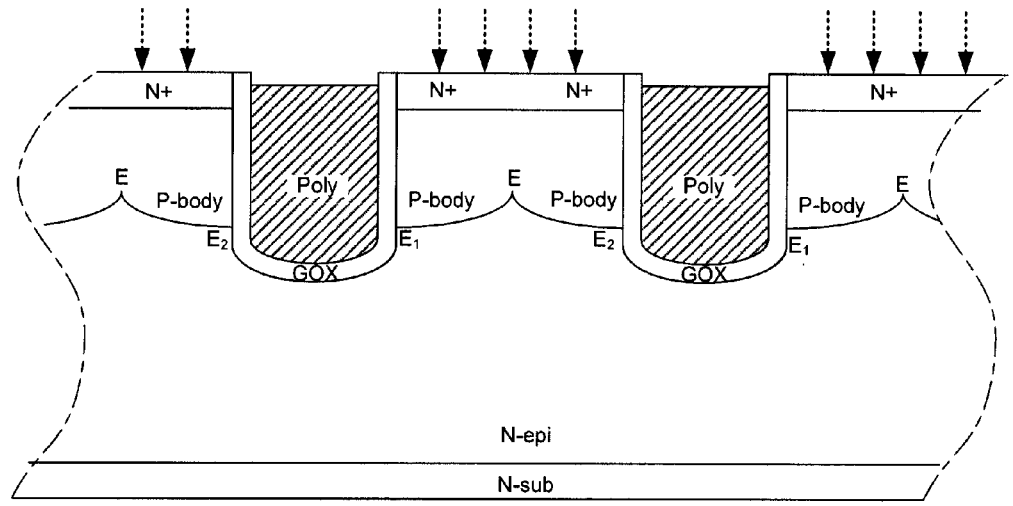

Referring to FIG. 6(e), step e comprises forming an N-type highly doped region in the top of the P-type body region P-body by ion implanting.

Figure 6F:
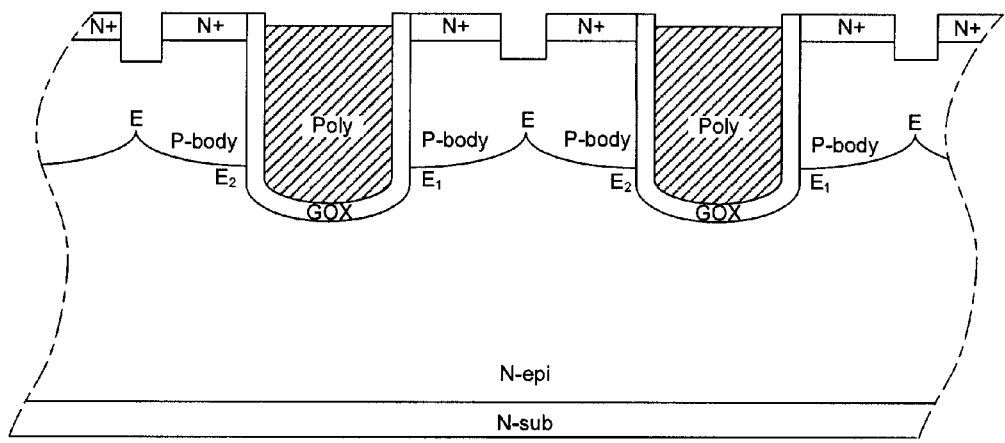

Referring to FIG. 6(f), step f comprises forming a trench extending from the top surface of the N-type highly doped region into the P-type body region P-body by etching.

Figure 6G:
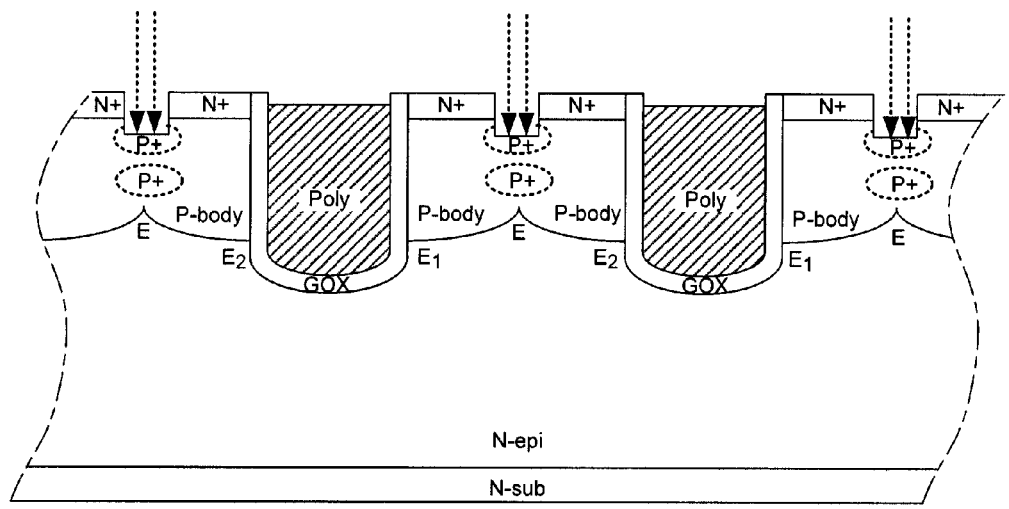

Referring to FIG. 6(g), step g comprises implanting P-type ions into the body region P-body through the trench with different energy level to form multiple P-type highly doped regions.

Figure 6H:
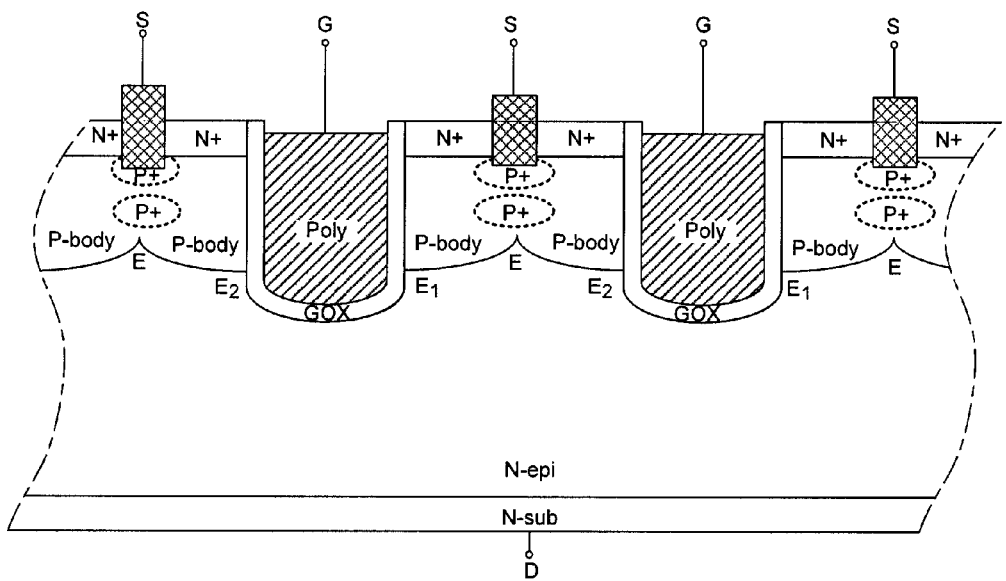

Referring to FIG. 6(h), step h comprises filling metal in the trench to form a source metal contact S.

In step c, only the middle part of the epitaxial layer N-epi between the gates of two adjacent trench-gate MOSFET devices is covered by the photo resist shield layer PR. Thus, in step d, a curving dopant profile shown by the curve $E_1$-$E$-$E_2$ is formed between the body region P-body and the epitaxial layer N-epi, and thereby the portion of the body region P-body under the source metal contact S has a smaller vertical thickness than the other portion of the body region P-body.

Figure 7:
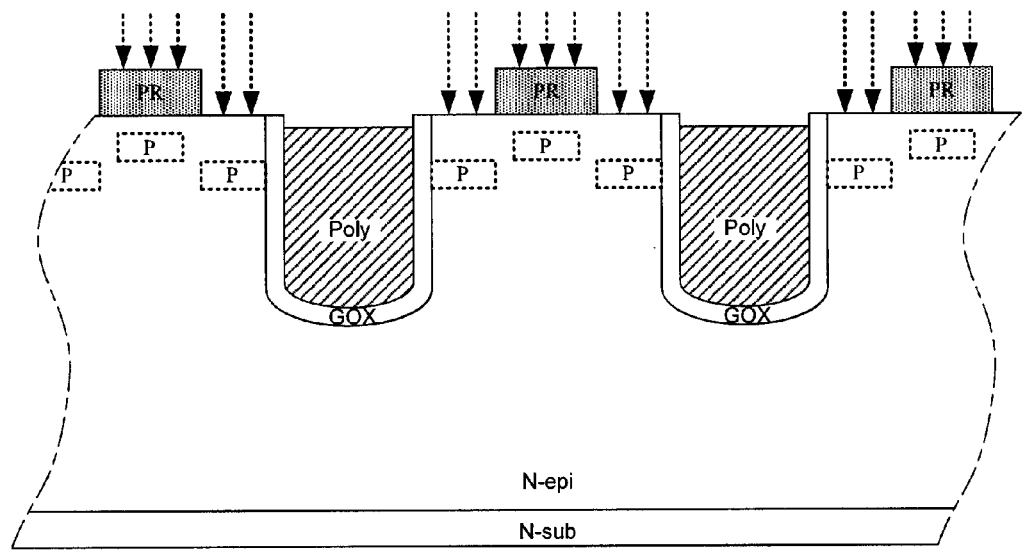
FIG. 7 illustrates a method for fabricating the MOSFET device of FIG. 5 in accordance with another embodiment of the present disclosure.

FIG. 7 illustrates a method for fabricating the MOSFET device of FIG. 5 in accordance with another embodiment of the disclosure. Referring to FIG. 7, step c comprises implanting P-type ions into the body region P-body with a higher energy level, so that the photo resist shield layer PR can not fully prevent the ions from entering into the portion of the body region P-body under the photo resist shield layer PR. Instead, the P-type ions in the portion of the body region P-body under the photo resist shield layer PR is closer to the top surface of the epitaxial layer N-epi compared with that in the other portion of the body region P-body. Afterward, a thermal driving-in process is conducted. As a result, a curving dopant profile shown by the curve $E_1$-$E$-$E_2$ is also formed to improve the UIS capability of the trench-gate MOSFET device.

Figure 8:
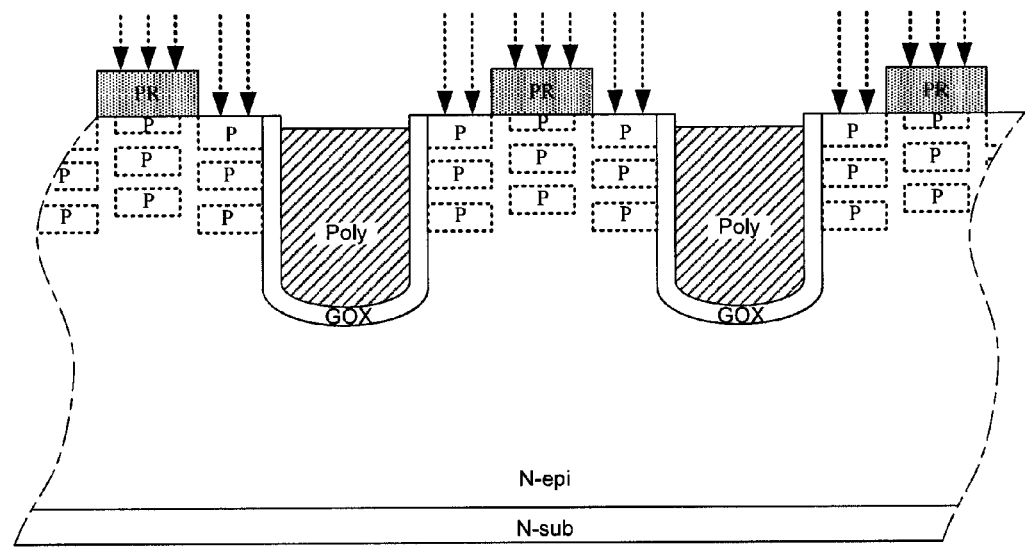
FIG. 8 illustrates a method for fabricating the MOSFET device of FIG. 5 in accordance with still another embodiment of the present disclosure.

FIG. 8 illustrates a method for fabricating the MOSFET device of FIG. 5 in accordance with still another embodiment of the disclosure. Referring to FIG. 8, step c comprises multiple P-type ion implanting, so that the photo resist shield layer PR can not fully prevent the ions from entering into the portion of the body region P-body under the photo resist shield layer PR. Instead, the P-type ions in the portion of the body region P-body under the photo resist shield layer PR is closer to the top surface of the epitaxial layer N-epi compared with that in the other portions of the body region P-body. Afterward, a thermal driving-in process is conducted. As a result, a curving dopant profile shown by the curve $E_1$-$E$-$E_2$ is also formed to improve the UIS capability of the trench-gate MOSFET device.

FIGS. 6(a)~6(h), FIG. 7 and FIG. 8 illustrate the steps for fabricating the trench-gate MOSFET device of FIG. 5. Persons of ordinary skill in the art will recognize, however, that the trench-gate MOSFET device of FIG. 4 can also be fabricated by the steps illustrated in FIGS. 6(a)~6(h) with only one P-type ion implanting is conducted in step g.

For convenience of description and not intended to be limiting, N-type trench-gate MOSFET devices are illustrated herein, but persons of ordinary skill in the art will understand that the present invention is not limited merely to N-type trench-gate MOSFET devices. P-type trench-gate MOSFET devices are also included within the spirit and scope of the present invention While at least one exemplary embodiment and method of fabrication has been presented in the foregoing detailed description of the invention, it should be appreciated that a vast number of variations exist. For example, in step c, other shielding objects, such as oxide, can be used to block the implanted ions instead of the photo resist shield layer. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

We claim:

1. A trench-gate MOSFET device, comprising:
   a substrate of a first conductive type;
   an epitaxial layer of the first conductive type formed on the substrate, wherein the epitaxial layer has a top surface;
   a gate dielectric layer formed in the epitaxial layer;
   a gate formed in the gate dielectric layer;
   a body region formed in the epitaxial layer adjacent to the gate dielectric layer, wherein the body region has a second conductive type opposite to the first conductive type;
   a source of the first conductive type formed on the body region;
   a source metal contact extending through the source into the body region; and
   at least one highly doped region of the second conductive type located in the body region under the source metal contact, wherein the at least one highly doped region has a higher doping concentration than the body region;
   wherein a curving dopant profile with a peak point under the at least one highly doped region is formed between the body region and the epitaxial layer so that the vertical distance between the peak point of the curving dopant profile and the top surface of the epitaxial layer is smaller than the vertical distance between the other portion of the curving dopant profile and the top surface of the epitaxial layer, and so that when a reverse breakdown occurs in the body diode of the trench-gate MOSFET device under undamped inductive switching condition, the electric field of the trench-gate MOSFET device converges around the peak point and a majority of the reverse current flows through the at least one highly doped region.

2. The trench-gate MOSFET device of claim 1, wherein one of the at least one highly doped region is in contact with the source metal contact.

3. The trench-gate MOSFET device of claim 1, wherein the trench-gate MOSFET device comprises more than one highly doped region positioned along a vertical orientation to the top surface of the epitaxial layer.

4. The trench-gate MOSFET device of claim 3, wherein the highly doped region positioned at the top of the vertical orientation is in contact with the source metal contact.

5. The trench-gate MOSFET device of claim 1, wherein a plurality of trench-gate MOSFET devices are fabricated together and every two adjacent MOSFET devices share a common source metal contact.

6. The trench-gate MOSFET device of claim 5, wherein the source metal contact is at the midpoint between the gates of two adjacent MOSFET devices.

* * * * *